United States Patent [19]
Yao et al.

[11] Patent Number: 5,763,006
[45] Date of Patent: Jun. 9, 1998

[54] METHOD AND APPARATUS FOR AUTOMATIC PURGE OF HMDS VAPOR PIPING

[75] Inventors: Chang-Chu Yao, Tainan; Tsun-Ching Lin, Hsin-Chu; Jo-Fei Wang, Hsin-Chu; Hsiao-Lan Yeh, Hsin-Chu, all of Taiwan

[73] Assignee: Taiwan Semiconductor Manufacturing Company, Ltd., Hsin-Chu, Taiwan

[21] Appl. No.: 725,756

[22] Filed: Oct. 4, 1996

[51] Int. Cl.$^6$ .................................... C23L 16/56
[52] U.S. Cl. .......................... 427/248.1; 427/255.1
[58] Field of Search .................. 427/248.1, 255.1; 118/715

[56] References Cited

U.S. PATENT DOCUMENTS

| | | | |
|---|---|---|---|
| 4,844,006 | 7/1989 | Page, Jr. et al. | 118/719 |
| 5,123,375 | 6/1992 | Hansen | 118/715 |
| 5,401,316 | 3/1995 | Shiraishi et al. | 118/689 |
| 5,501,870 | 3/1996 | Shiraishi et al. | 427/8 |
| 5,505,781 | 4/1996 | Omori et al. | 118/726 |

*Primary Examiner*—Shrive Beck
*Assistant Examiner*—Timothy Meeks
*Attorney, Agent, or Firm*—George O. Saile; Stephen B. Ackerman; Larry J. Prescott

[57] ABSTRACT

A number of air actuated valves are added to a conventional apparatus for treating semiconductor wafers with HMDS, hexamethyl-disilazane, vapor to improve the adhesion between the wafers and resist layers. These valves allow for automatic purging of the HMDS vapor from the pipes in the apparatus by dry nitrogen thereby preventing HMDS vapor condensation in the pipes which leads to contamination of the HMDS supply. The valve system prevents any back-streaming of nitrogen gas into the HMDS supply tank.

8 Claims, 2 Drawing Sheets

FIG. 1 – Prior Art

METHOD AND APPARATUS FOR AUTOMATIC PURGE OF HMDS VAPOR PIPING

BACKGROUND OF THE INVENTION

(1) Field of the Invention

This invention relates to the treatment of semiconductor wafers with HMDS vapor to improve resist adhesion. More particularly the invention relates to a method and apparatus for purging the pipes of the system after wafer treatment to prevent HMDS condensation in the pipes.

(2) Description of the Related Art

U.S. Pat. No. 5,501,870 to Shiraishi et al. and U.S. Pat. No. 5,401,316 to Shiraishi et al. describe apparatus and methods for treating semiconductor wafers with HMDS vapor to improve resist adhesion but do not describe methods for purging the pipes in the apparatus to prevent HMDS condensation.

U.S. Pat. No. 5,505,781 to Omori et al. describes an apparatus for treating semiconductor wafers with HMDS vapor to improve resist adhesion. A HMDS liquid and vapor delivery system is described but automatic purging of the pipes in the apparatus to prevent HMDS condensation is not described.

This Patent Application describes an apparatus and method for treating semiconductor wafers with HMDS vapor wherein HMDS vapor is purged from the pipes after the wafer treatment is complete. The purging of the pipes prevents HMDS condensation and contamination of the HMDS supply.

SUMMARY OF THE INVENTION

In the manufacture of semiconductor integrated circuits patterning of metal and dielectric layers using patterns formed in a layer of resist, such as photoresist, is used extensively. In such processing the layer of resist: is formed on a semiconductor wafer and a pattern formed in the resist layer. It is very important that the adhesion of the resist layer to the semiconductor wafer be very good or the pattern transferred to the metal or dielectric layer will be defective. Moisture between the semiconductor wafer and the resist layer will result in loss of adhesion between the resist and the wafer and it is therefor of critical importance to avoid moisture between the resist and the wafer.

One technique in use to avoid the formation of moisture between the wafer and the resist is to treat the surface of the wafer on which the resist will be formed so as to make the surface of the wafer hydrophobic. This avoids the formation of water on the wafer surface and improves the resist to wafer adhesion. One method in use today to make the wafer surface hydrophobic is to expose the surface of the wafer to HMDS, hexamethyl-disilazane, gas. This hydrophobic treatment of the wafer surface with HMDS gas improves the wafer to resist adhesion.

A conventional method and apparatus used for the exposure of the wafer to HMDS gas will be described with reference to FIG. 1. FIG. 1 shows a tank 40 with liquid HMDS 44 at the lower part of the tank 40 and a mixture of HMDS gas and nitrogen gas 46 in the upper part of the tank 40. A source of HMDS 12 adds liquid HMDS to the tank 40 as needed through a pipe 62. A pipe 60 connected to an air actuated valve 32 connects a nitrogen gas source 10 to the upper part of the tank 46. A pipe 66 connected to an air actuated valve 34 connects a nitrogen gas source 10 to a nitrogen bubbler 42 inside the tank 40 and submerged in the liquid HMDS 44. The air actuated valves 32 and 34 are controlled by the same air actuation source 30 and are connected to the air actuation source 30 by a control line 48. The control lines are shown in the drawings as single lines and pipes for nitrogen or HMDS are shown as double lines.

When the air actuated valves 32 and 34 are open nitrogen gas from the nitrogen bubbler 42 forms a mixture of HMDS gas and nitrogen gas in the upper part 46 of the tank 540 and into the pipe 64 connected to an air actuated valve 36 controlled by an air actuation source 14. A source of dry nitrogen gas 18 is connected to another air actuation valve 38 controlled by an air actuation source 16. When air actuation valve 36 is open a pipe 68 delivers HMDS gas to a nozzle 20. When air actuation valve 38 is open a pipe 70 delivers dry nitrogen gas to the nozzle 20.

A semiconductor wafer 22 is attached to a wafer holder in a controlled atmosphere chamber 50. A hot plate 24 controls the temperature of the wafer 22. Gas is exhausted from the chamber 50 through an exhaust pipe 74 to an exhaust means 76 for handling the waste gasses. The nozzle directs a stream of gas 72 onto the wafer 22 surface. The wafer holder holds the wafer 22 in either an up position near the nozzle, as shown in FIG. 1, or in a down position away from the nozzle, not shown.

When air actuated valves 32, 34, and 36 are open and air actuated valve 38 is closed the stream of gas 72 directed onto the wafer 22 surface is a mixture of HMDS gas and nitrogen gas to accomplish the hydrophobic treatment of the wafer. During this part of the cycle the wafer holder is in the up position and the temperature of the wafer 22 is controlled by the hot plate 24. When the hydrophobic treatment cycle is completed the wafer holder is moved to the down position, air actuated valve 36 is closed, air actuated valve 38 is opened, and the controlled atmosphere chamber 50 is purged with dry nitrogen.

One of the problems with the method and apparatus just described is that during the time the controlled atmosphere chamber 50 is being purged HMDS gas and nitrogen gas is trapped in the pipe 64 which supplies HMDS gas to the air actuated valve 36. This trapped HMDS vapor condenses in the pipe 64 and may drip back into the tank 40. This condensation of HMDS vapor and dripping of HMDS back into the tank 40 causes contamination of the HMDS vapor for treatment of subsequent wafers and adversely affects wafer quality.

It is a principle objective of this invention to provide an apparatus for HMDS vapor treatment of semiconductor wafers which avoids HMDS contamination.

It is a further objective of this invention to provide a method for HMDS vapor treatment of semiconductor wafers which avoids HMDS contamination.

These objectives are achieved by adding three air actuated valves to the apparatus shown in FIG. 1 and described above whereby the piping supplying the HMDS vapor can be automatically purged with dry nitrogen after the treatment of the wafer surface with HMDS vapor.

DESCRIPTION OF THE PREFERRED EMBODIMENTS

Figure 1:
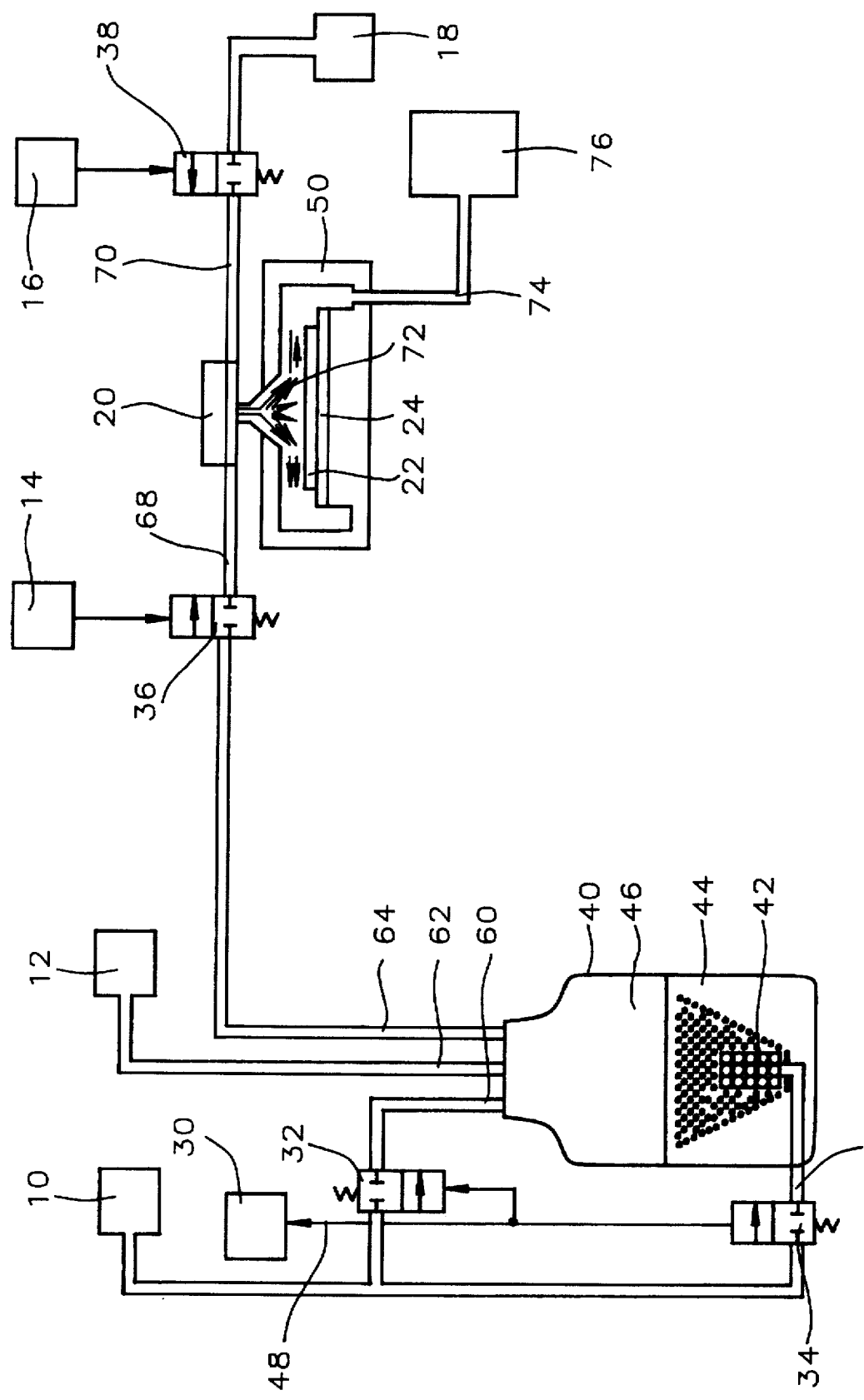
FIG. 1 shows a diagram of the conventional apparatus used for HMDS vapor treatment of a semiconductor wafer surface.
Figure 2:
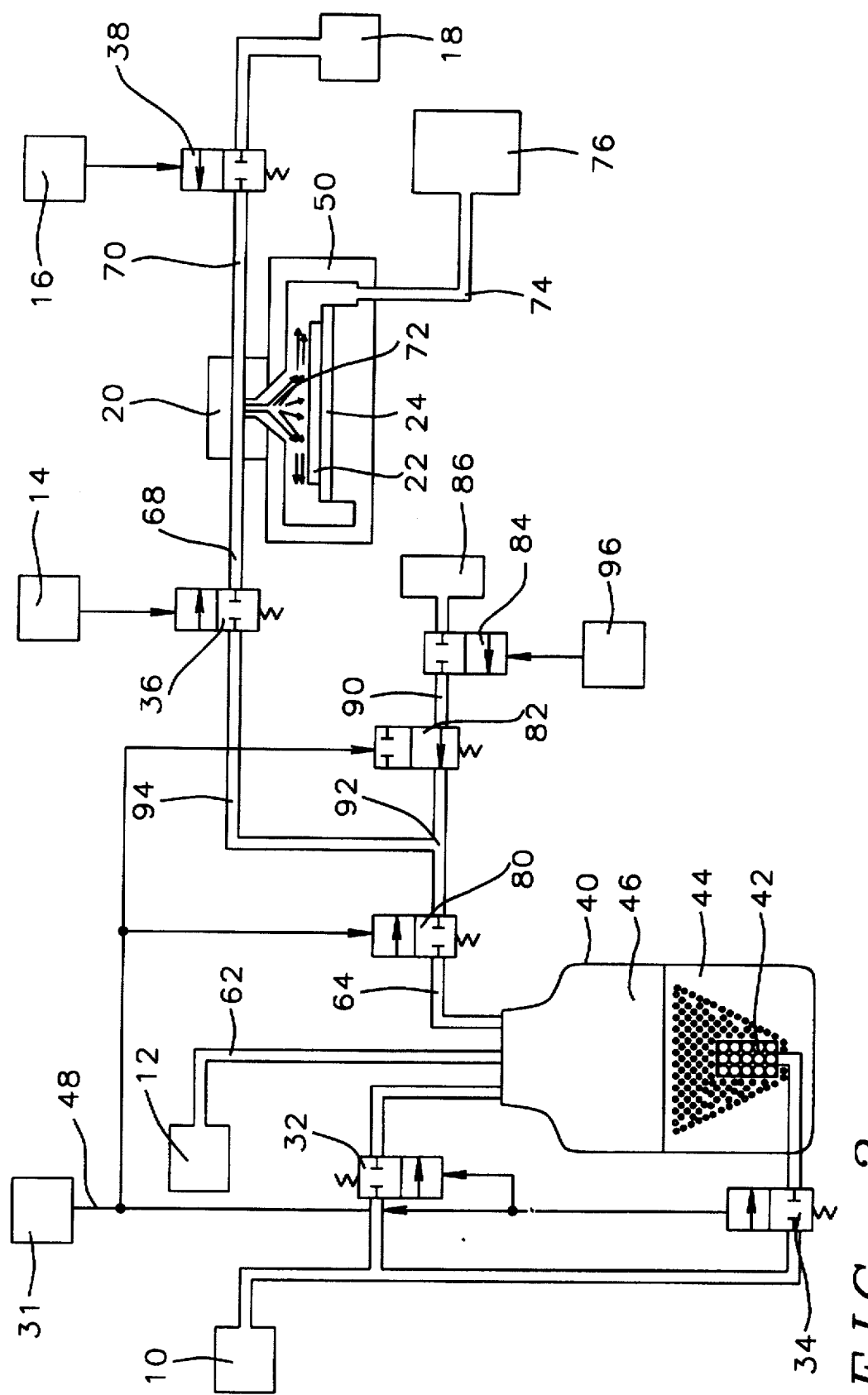
FIG. 2 shows a diagram of the apparatus of this invention used for HMDS vapor treatment of a semiconductor surface.

Refer now to FIG. 2, there is shown a diagram of the apparatus of this invention for treatment of semiconductor wafers with HMDS, hexamethyl-disilazane, vapor. As shown in FIG. 2, a first air actuated valve 80, second air actuated valve 82, and third air actuated valve 84 are added to the apparatus shown in FIG. 1. FIG. 2 shows a tank 40 with liquid HMDS 44 at the lower part of the tank 40 and a mixture of HMDS vapor and nitrogen gas 46 in the upper part of the tank 40. A source of HMDS 12 adds liquid HMDS to the tank 40 as needed through a sixth pipe 62. An eighth pipe 60 connected to a sixth air actuated valve 32 connects a nitrogen gas source 10 to the upper part of the tank 46. A ninth pipe 66 connected to a seventh air actuated valve 34 connects a nitrogen gas source 10 to a nitrogen bubbler 42 inside the tank 40 and submerged in the liquid HMDS 44. The first air actuated valve 80, second air actuated valve 82, sixth air actuated valve 32, and seventh air actuated valve 34 are all controlled by the same air actuation source 31 and are connected to the air actuation source 31 by a control line 48. The control lines are shown in the drawings as single lines and pipes for nitrogen or HMDS are shown as double lines. When the sixth air actuated valve 32 and seventh air actuated valve 34 are open nitrogen gas from the nitrogen bubbler 42 forms a mixture of HMDS vapor and nitrogen gas in the upper part 46 of the tank 40 and into the seventh pipe 64 connected to the first air actuated valve 80.

A first pipe 92 is connected between the first air actuated valve 80 and the second air actuated valve 82. The first air actuated valve 80, second air actuated valve 82, sixth air actuated valve 32, and seventh air actuated valve 34 are all controlled by the same air actuation source 31 and connected such that when the first air actuated valve 80, sixth air actuated valve 32, and seventh air actuated valve 34 are open the second air actuated valve 82 is closed and when the first air actuated valve 80, sixth air actuated valve 32, and seventh air actuated valve 34 are closed the second air actuated valve 82 is open. A second pipe 94 is attached to a port in the first pipe 92 and connected to a fourth air actuated valve 36. A third air actuated valve 84 is connected to a source 86 of dry nitrogen gas. A third pipe 90 is connected between the second air actuated valve 82 and a third air actuated valve 84.

A nozzle 20 is connected to the fourth air actuated valve 36 by a fourth pipe 68. A fifth air actuated valve 38 is connected to the nozzle 20 by a fifth pipe 70 and to a source 18 of dry nitrogen gas. Although FIG. 2 shows the third air actuated valve 84 and the fifth air actuated valve 38 connected to separate sources of dry nitrogen gas those skilled in the art will readily recognize that they could be connected to the same source of dry nitrogen gas. A semiconductor wafer 22 is attached to a wafer holder in a controlled atmosphere chamber 50. A hot plate 24 controls the temperature of the wafer 22. Gas is exhausted from the chamber 50 through an exhaust pipe 74 to an exhaust means 76 for handling the waste gasses. The nozzle directs a stream of gas 72 onto the wafer 22 surface. The wafer holder holds the wafer 22 in either an up position near the nozzle, as shown in FIG. 2, or in a down position away from the nozzle, not shown. During the period the wafer surface is being treated with HMDS vapor the wafer holder is in the up position. The third air actuated valve 84 is connected such that when the wafer holder is in the up position the third air actuated valve 84 is closed and when the wafer holder is in the down position the third air actuated valve 84 is open.

The process used to treat semiconductor wafers with HMDS vapor proceeds as follows. First the first air actuated valve 80 is closed, the second air actuated valve 82 is open, the wafer holder is in the down position whereby the third air actuated valve 84 is open, the fourth air actuated valve 36 is closed, the fifth air actuated valve 38 is closed, the sixth air actuated valve 32 is closed, and the seventh air actuated valve 34 is closed. The semiconductor wafers are then put in place in the wafer holder and the system is closed.

Next the first air actuated valve 80 is opened, the second air actuated valve 82 is closed, the wafer holder is in the up position whereby the third air actuated valve 84 is closed, the fourth air actuated valve 36 is closed, the fifth air actuated valve 38 is closed, the sixth air actuated valve 32 is opened, and the seventh air actuated valve 34 is opened. This allows HMDS vapor into the first pipe 92 and second pipe 94. After the wafer is heated to the proper temperature the fourth air actuated valve is opened, HMDS vapor passes through the fourth pipe 68 to the nozzle 20 and the wafers are treated with HMDS vapor.

Next, after treatment of the wafers with HMDS vapor, the wafer is no longer heated, the first air actuated valve 80 is closed, the second air actuated valve 82 is opened, the wafer holder is moved to the down position whereby the third air actuated valve 84 is opened, the fourth air actuated valve 36 remains open, the fifth air actuated valve 38 remains closed, the sixth air actuated valve 32 is closed, and the seventh air actuated valve 34 is closed. This allows dry nitrogen to pass through the first pipe 92, the second pipe 94, the third pipe 90, and the fourth pipe 68 thereby completely purging the system of HMDS vapor and preventing the condensation of HMDS vapor into liquid in these pipes. The first air actuated valve 80 prevents any backstreaming of nitrogen gas into the tank 40.

Next the fourth air actuated valve 36 is closed and the fifth air actuated valve 38 is opened and the fifth pipe 70 is purged. Next the fourth air actuated valve 36 remains closed and the fifth air actuated valve 38 is again closed and the processed wafers are removed. This apparatus and method prevents the formation of liquid HMDS in the pipes and prevents contamination of the HMDS supply.

While the invention has been particularly shown and described with reference to the preferred embodiments thereof, it will be understood by those skilled in the art that various changes in form and details may be made without departing from the spirit and scope of the invention.

What is claimed is:

1. A method of treating semiconductor wafers with hexamethyl-disilazane, comprising the steps of:

providing a number of semiconductor wafers;

providing a means for generating a mixture of hexamethyl-disilazane gas mixed with nitrogen gas;

providing a source of dry nitrogen gas;

providing a controlled atmosphere chamber having an input port and an exhaust port;

providing a nozzle having a first input port, a second input port, and an output port wherein said output port of said nozzle is connected to said input port of said controlled atmosphere chamber;

providing a semiconductor wafer holder for holding said semiconductor wafers in said controlled atmosphere chamber wherein said semiconductor wafer holder is in either an up position or a down position;

providing a means for heating said semiconductor wafers;

providing a first valve having a first port and a second port wherein said first port of said first valve is connected to said means for generating a mixture of hexamethyl-disilazane gas mixed with nitrogen gas;

providing a second valve having a first port and a second port;

providing a third valve having a first port and a second port wherein said second port of said third valve is connected to said source of dry nitrogen gas;

providing a fourth valve having a first port and a second port wherein said second port of said fourth valve is connected to said first input port of said nozzle;

providing a fifth valve having a first port and a second port wherein said first port of said fifth valve is connected to said second input port of said nozzle and said second port of said fifth valve is connected to said source of dry nitrogen gas;

providing a first pipe having a first end, a second end, and a connecting port between said first end and said second end, wherein said first end of said first pipe is connected to said second port of said first valve and said second end of said first pipe is connected to said first port of said second valve;

providing a second pipe having a first end and a second end wherein said first end of said second pipe is connected to said connecting port of said first pipe and said second end of said second pipe is connected to said first port of said fourth valve;

providing a third pipe having a first end and a second end wherein said first end of said third pipe is connected to said second port of said second valve and said second end of said third pipe is connected to said first port of said third valve;

providing means for opening and closing said first valve and said second valve wherein said second valve is open when said first valve is closed and said second valve is closed when said first valve is open;

providing means for opening and closing said third valve wherein said third valve is closed when said semiconductor wafer holder is in said up position and said third valve is open when said semiconductor wafer holder in said down position;

providing means for opening and closing said fourth valve;

providing means for opening and closing said fifth valve;

providing exhaust means connected to said exhaust port of said controlled atmosphere chamber;

placing said semiconductor wafer holder in said down position;

placing said semiconductor wafers on said semiconductor wafer holder while said semiconductor wafer holder is in said down position;

exposing said semiconductor wafers to said mixture of hexamethyl-disilazane gas and nitrogen gas by opening said first valve, closing said second valve, placing said wafer holder in said up position thereby closing said third valve, opening said fourth valve, and closing said fifth valve; and purging said first pipe, said second pipe, and said third pipe with dry nitrogen gas by closing said first valve, opening said second valve, placing said wafer holder in said down position thereby opening said third valve, opening said fourth valve, and closing said fifth valve.

2. The method of claim 1 wherein said first valve, said second valve, said third valve, said fourth valve, and said fifth valve are air actuated valves controlled by a number of air actuation sources.

3. The method of claim 1 wherein said first valve and said second valve are air actuated valves and both said first valve and said second valve are controlled by a first air actuation source.

4. The method of claim 1 wherein said third valve is an air actuated valve controlled by an air actuation source and said air actuation source is controlled by whether said semiconductor wafer holder is in said up position or said down position.

5. The method of claim 4 wherein said third valve is closed when said semiconductor wafer holder is in said up position and open when said semiconductor wafer holder is in said down position.

6. The method of claim 1 wherein said means for heating said semiconductor wafers is a hot plate.

7. The method of claim 1 wherein said means for generating a mixture of hexamethyl-disilazane gas mixed with nitrogen gas comprises a nitrogen gas supply connected to a nitrogen bubbler wherein said nitrogen bubbler is immersed in liquid hexamethyl-disilazane.

8. The method of claim 1 wherein said source of dry nitrogen gas comprises a first source of dry nitrogen gas and a second source of dry nitrogen gas, said second port of said third valve is connected to said first source of dry nitrogen gas, and said second port of said fifth valve is connected to said second source of dry nitrogen gas.

* * * * *